United States Patent
Matsumoto

(10) Patent No.: US 7,116,179 B2
(45) Date of Patent: Oct. 3, 2006

(54) CRYSTAL OSCILLATOR

(75) Inventor: Takashi Matsumoto, Sayama (JP)

(73) Assignee: Nihon Dempa Kogyo Co., Ltd., Sayama (JP)

(*) Notice: Subject to any disclaimer, the term of this patent is extended or adjusted under 35 U.S.C. 154(b) by 44 days.

(21) Appl. No.: 10/970,245

(22) Filed: Oct. 21, 2004

(65) Prior Publication Data
US 2005/0088251 A1 Apr. 28, 2005

(30) Foreign Application Priority Data
Oct. 23, 2003 (JP) ............... 2003-363307
Oct. 6, 2004 (JP) ............... 2004-294259

(51) Int. Cl.
*H03B 1/00* (2006.01)
*H03B 5/32* (2006.01)
*H03K 9/00* (2006.01)
*H05K 5/00* (2006.01)

(52) U.S. Cl. .................. 331/68; 331/67; 331/158; 361/752; 174/35 R

(58) Field of Classification Search ............. 331/68, 331/158, 67; 310/340, 348; 174/35 R; 361/752
See application file for complete search history.

(56) References Cited

U.S. PATENT DOCUMENTS 6,097,132 A * 8/2000 Inoi et al. .................. 310/345
6,118,347 A * 9/2000 Ohira ......................... 331/68
6,833,653 B1 * 12/2004 Hyun et al. ................ 310/344

FOREIGN PATENT DOCUMENTS

JP    A-2000-165177    6/2000

* cited by examiner

*Primary Examiner*—Robert Pascal
*Assistant Examiner*—James Goodley
(74) *Attorney, Agent, or Firm*—Greer, Burns & Crain, Ltd.

(57) ABSTRACT

A crystal oscillator comprises a rectangular circuit substrate for mounting circuit devices and its metal cover, said circuit substrate has grooves on each long side and on each short side and said metal cover has projections at each aperture end corresponding to the grooves, and which has a swelling from external to internal in each of the projections, wherein both the grooves provided on each short side and the projection of said metal cover are provided at one end of each long side or each short side.

2 Claims, 6 Drawing Sheets

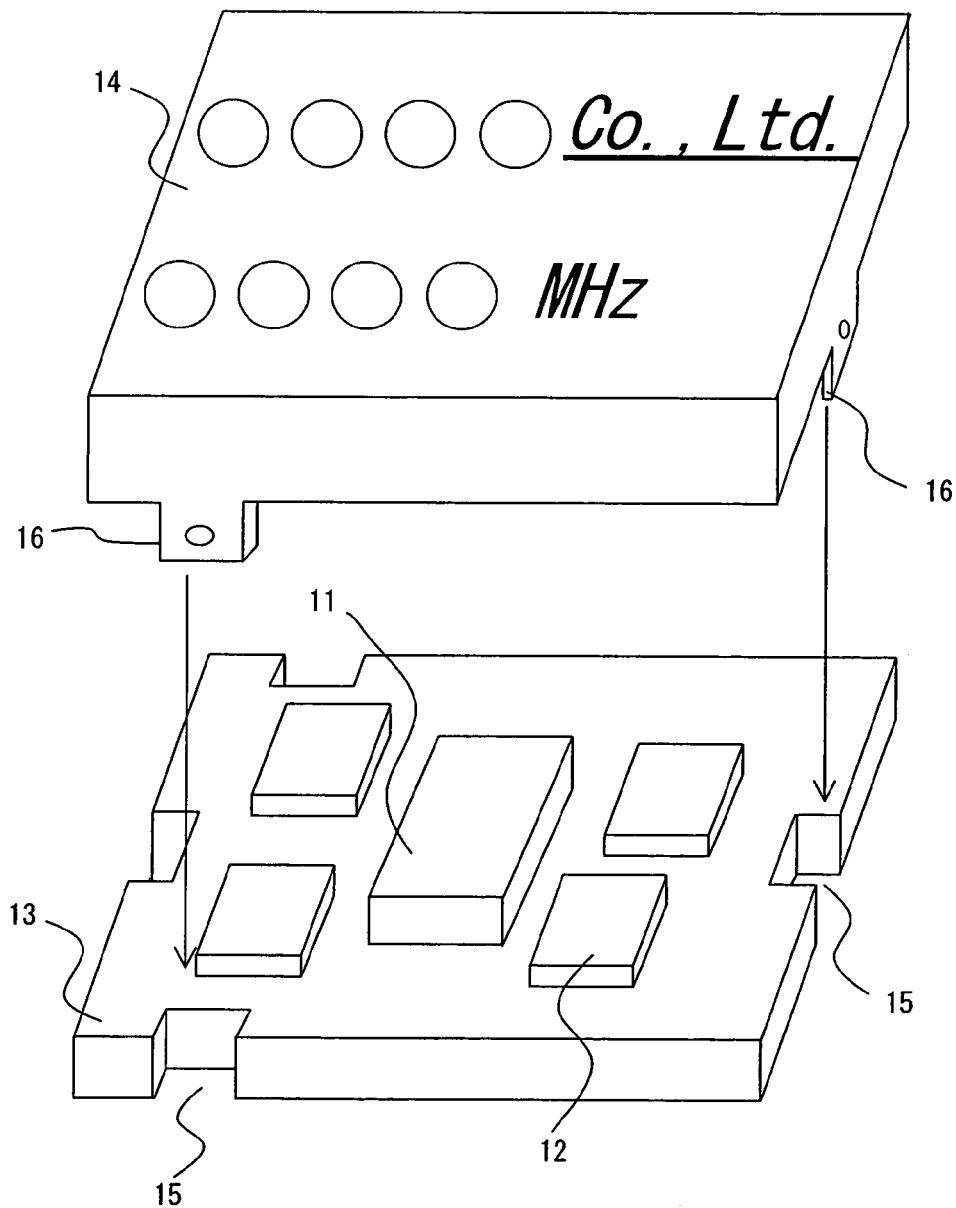
F I G. 6

CRYSTAL OSCILLATOR

BACKGROUND OF THE INVENTION

1. Field of the Invention

The present invention relates to a crystal oscillator and more particularly to a circuit substrate on which a crystal vibrator and circuit devices are mounted, and its cover.

2. Description of the Related Art

A crystal oscillator is built in a variety of electronic devices, as the reference source of frequency or time. Such a crystal oscillator includes, for example, a PLL (phase-locked loop) voltage control oscillator usually composed of discrete components.

FIG. 1 is the exploded view of one conventional crystal oscillator.

The crystal oscillator comprises a circuit substrate 13 on which a crystal vibrator 11 composing a voltage control oscillator, and circuit devices 12, such as a voltage variable capacitor device and the like, and its metal cover 14. The circuit substrate 13 is made of glass epoxy and is rectangular with a long side and a short side. The circuit substrate 13 also has grooves 15 formed by through-hole processing at the center of each the long side and each short side. The circuit substrate also has a through-hole connected to a circuit pattern, which is not shown in FIG. 1, in four its corners, and the metal cover 14 is connected to mounting terminals on the base plate.

The metal cover is concave, and has a projection 16 at each aperture end, corresponding to the groove 15 at each long side and each short side of the circuit substrate 13. The metal cover 14 has a swelling from external to internal in the projection 16. The aperture end of the metal cover 14 is mounted around the external circumference of the circuit substrate 13 and is jointed with the circuit substrate 13 by fitting each projection 16 in each groove on each long side and each short side. Then, the metal cover 14 is jointed by soldering with the circuit substrate 13.

In this case, usually, the metal cover 14 on which characters, such as an oscillation frequency, a manufacturer name and the like, are in advance printed is jointed with the circuit substrate 13. Alternatively, after the metal cover 14 is jointed with the circuit substrate 13, characters can be printed on the metal cover 14.

Then, a user sets the crystal oscillator in a set substrate in the reading direction of the characters.

However, any crystal oscillator with such a configuration has a groove 15 at the center of each long side and each short side, and is symmetrical against a center line equally dividing each long or short side into two. Therefore, for example, when the metal cover 14 with printed characters is jointed with the circuit substrate 13, sometimes the reading direction of the characters is inverted, which is a problem.

In this case, if the characters are arrayed from left to right (in the reading direction of characters), as shown in FIG. 2, terminals 21 through 24 are clockwise provided on the rear surface of the circuit substrate 13 in that order. However, if the array of characters is inverted, as shown in FIG. 3, the terminals are clockwise provided in order of the grounding terminal 23, the miscellaneous terminal 24, the power supply terminal 21 and the output terminal 22 when viewed from the reading direction of the characters.

In FIG. 4, the metal cover 14 shown in FIG. 3 is inverted so that the characters can be read.

As shown in FIG. 5, in the set substrate 50 for mounting the crystal oscillator, each circuit terminal is formed in accordance with each terminal of the crystal oscillator. Specifically, a power terminal 51, an output terminal 52, a grounding terminal 53 and a miscellaneous terminal 54 are clockwise formed in accordance with the terminals 21 through 24 of the crystal oscillator whose characters are correctly printed.

Therefore, if the metal cover 14 is jointed with the circuit substrate 13 in such a way that the characters are inverted, each terminal of the crystal oscillator is not matched with each circuit terminal of the set substrate since a user mounts the crystal oscillator on the set substrate 50 in the reading direction of characters. For this reason, even if the crystal oscillator is mounted on the set substrate 50, the crystal oscillator does not correctly operate to incur abnormality.

If the characters are printed on the metal cover 14 after jointing the metal cover 14 with the circuit substrate 13 and assembling the crystal oscillator, sometimes the characters are inverted similarly. In this case too, when mounting the crystal oscillator on the set substrate 50, similarly the crystal oscillator does not correctly operate to incur abnormality.

Patent Reference 1: Japanese Patent Application No. 2000-165177

SUMMARY OF THE INVENTION

The crystal oscillator of the present invention comprises a rectangular circuit substrate for mounting circuit devices, and a metal cover. The circuit substrate has a groove when viewed from top on each long side and each short side. The groove can be shaped in a katakana character "⊐" when viewed from top. The metal cover has a projection at each aperture end corresponding to each groove. In the crystal oscillator whose projection has a swelling from external to internal, the groove provided for each long or short side of the circuit substrate and the projection of the metal cover are provided at one end in each long or short side.

It is an object of the present invention to provide a circuit substrate for determining the array direction of characters, and its metal cover.

According to the above-mentioned configuration, the groove of the circuit substrate and the projection of the metal cover are provided at one end of each long side, and each long side is unsymmetrical against a center line equally dividing the long side into two. In this case, if the projection of the metal cover is not matched with the groove at one end, the metal with printed characters cannot be fit in the circuit substrate. Thus, by jointing a metal cover with a circuit substrate on which each circuit terminal is regularly disposed, in the reading direction of characters, the crystal oscillator can be correctly mounted on the set substrate.

Even if characters are printed after jointing the metal cover with the circuit substrate, they can be printed based on one end with a projection and a groove. In this case, the characters are never inverted. Thus, the crystal oscillator can be correctly mounted on the set substrate. Even when a projection and a groove on the short side are provided at one end, the same applies. However, in the case of a small crystal oscillator, it is preferable to provide the projection and groove on the long side since they can be more easily recognized.

BRIEF DESCRIPTION OF THE DRAWINGS

FIG. 6 is the exploded view of the crystal oscillator in one preferred embodiment of the present invention.

DETAILED DESCRIPTION OF THE PREFERRED EMBODIMENT

The preferred embodiment of the present invention is described below with reference to the drawings.

Figure 1:
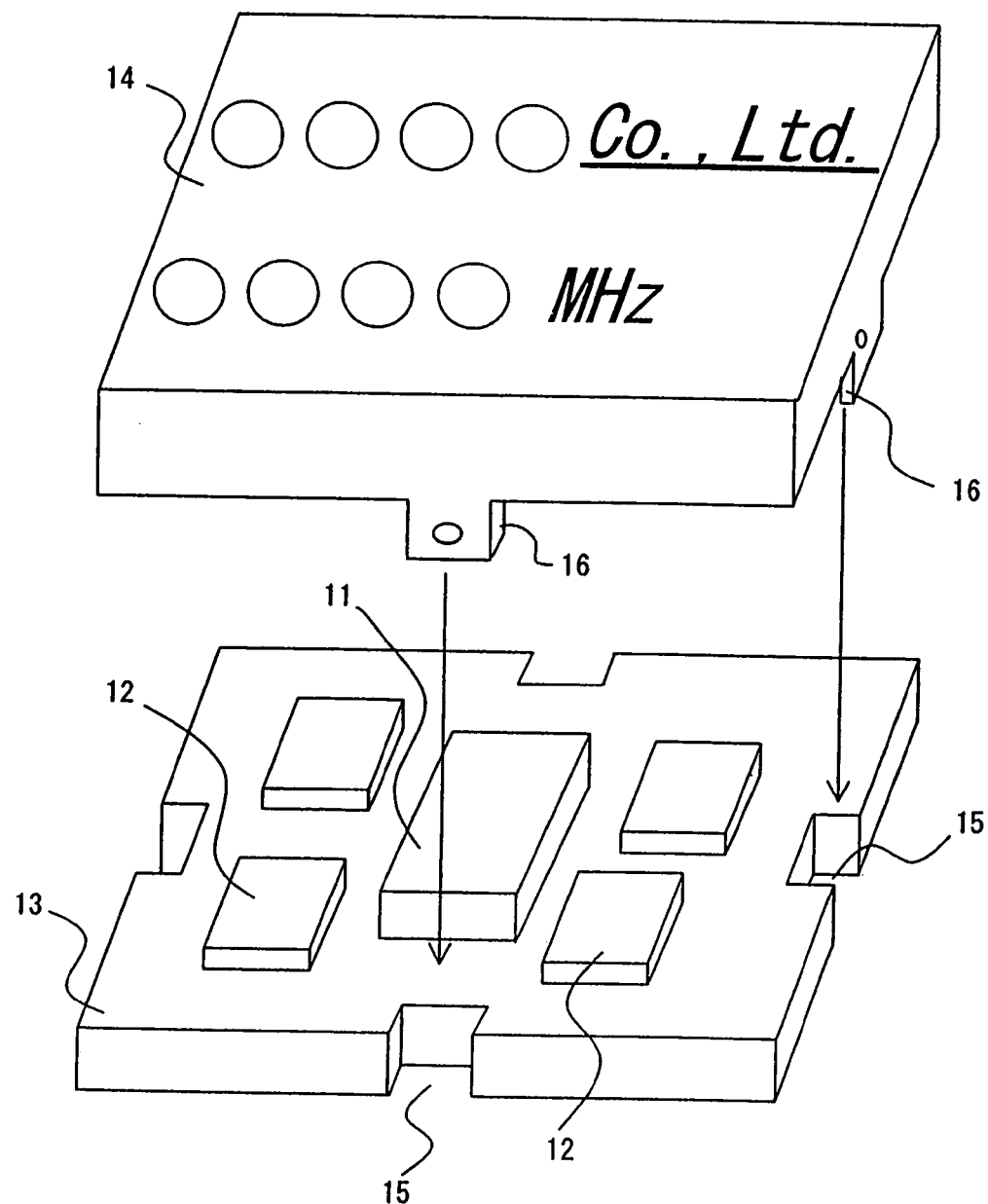
FIG. 1 is the exploded view of the conventional crystal oscillator.
Figure 2:
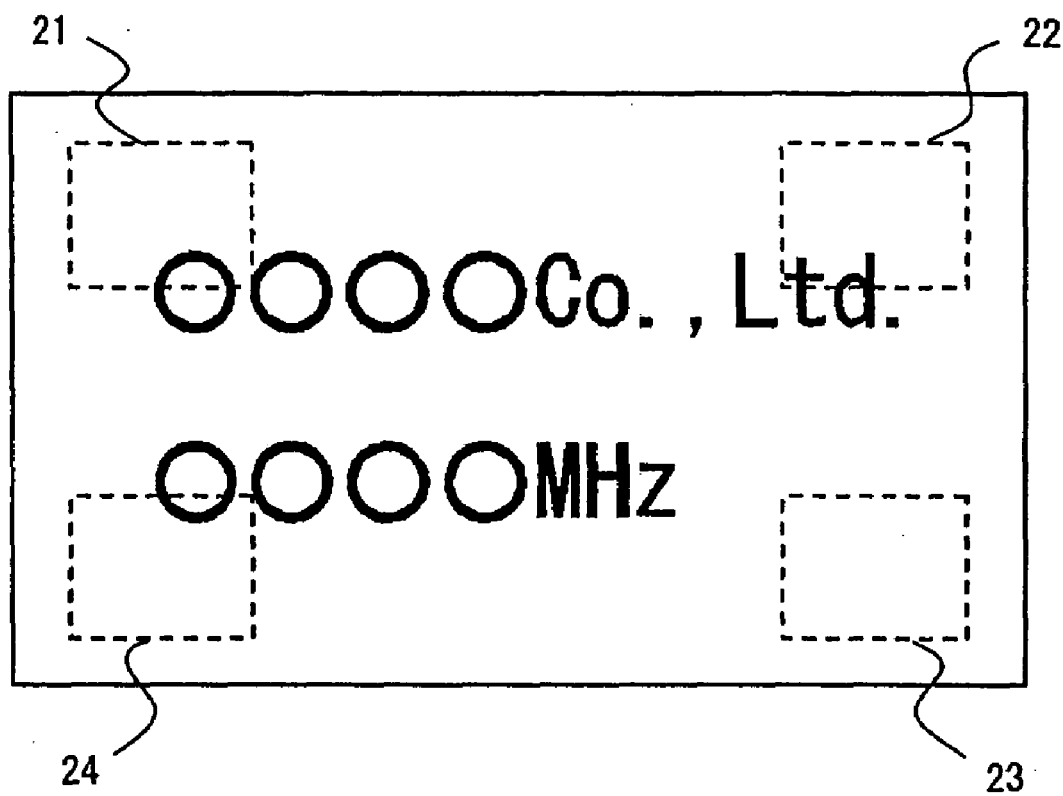
FIG. 2 is the perspective illustration of the conventional crystal oscillator used to explain the problems.
Figure 3:
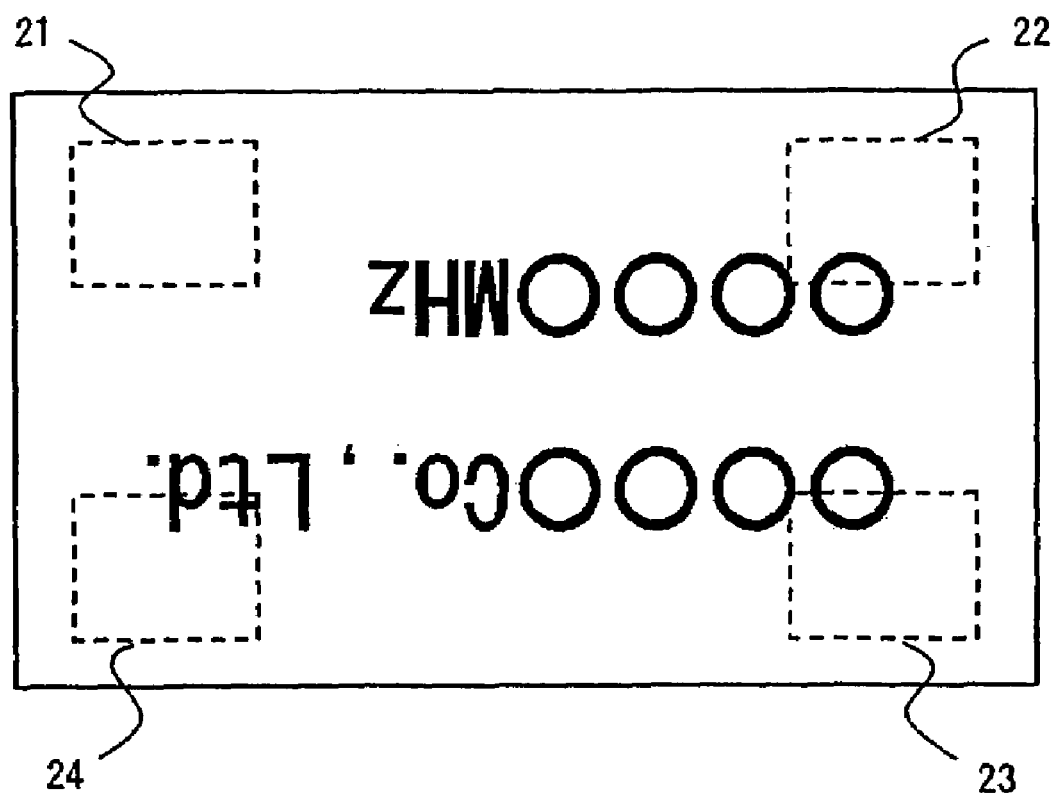
FIG. 3 is the perspective illustration of the conventional crystal oscillator used to explain the problems.
Figure 4:
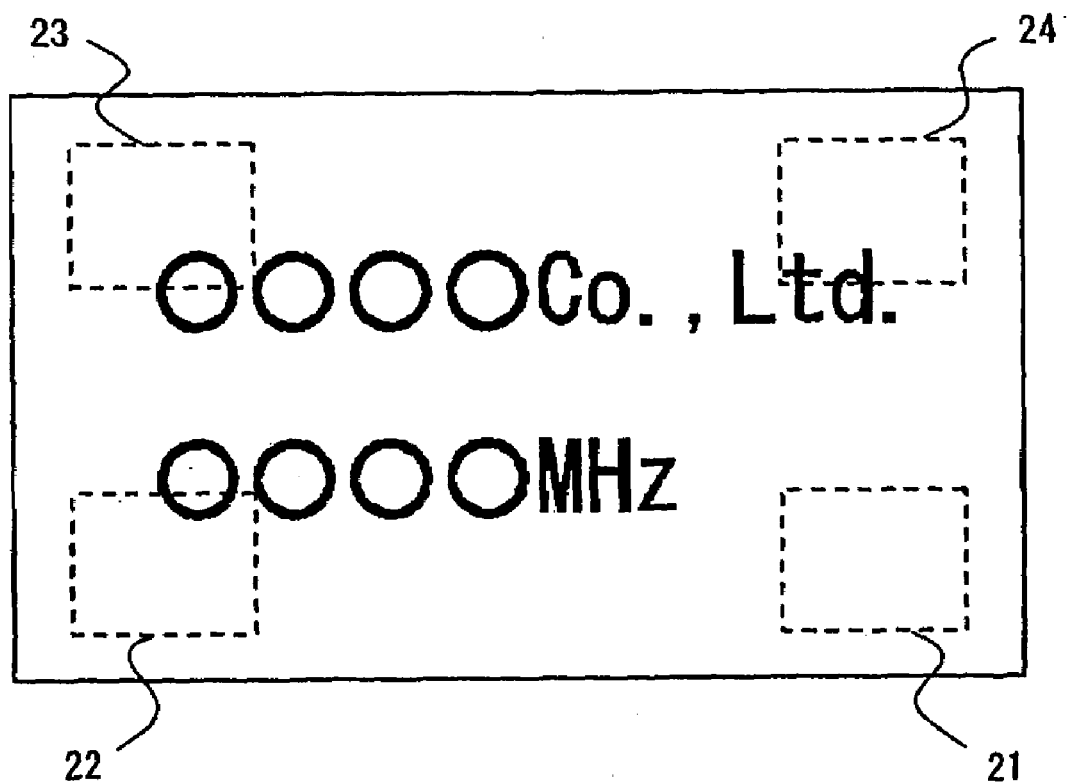
FIG. 4 is the perspective illustration of the conventional crystal oscillator used to explain the problems.
Figure 5:
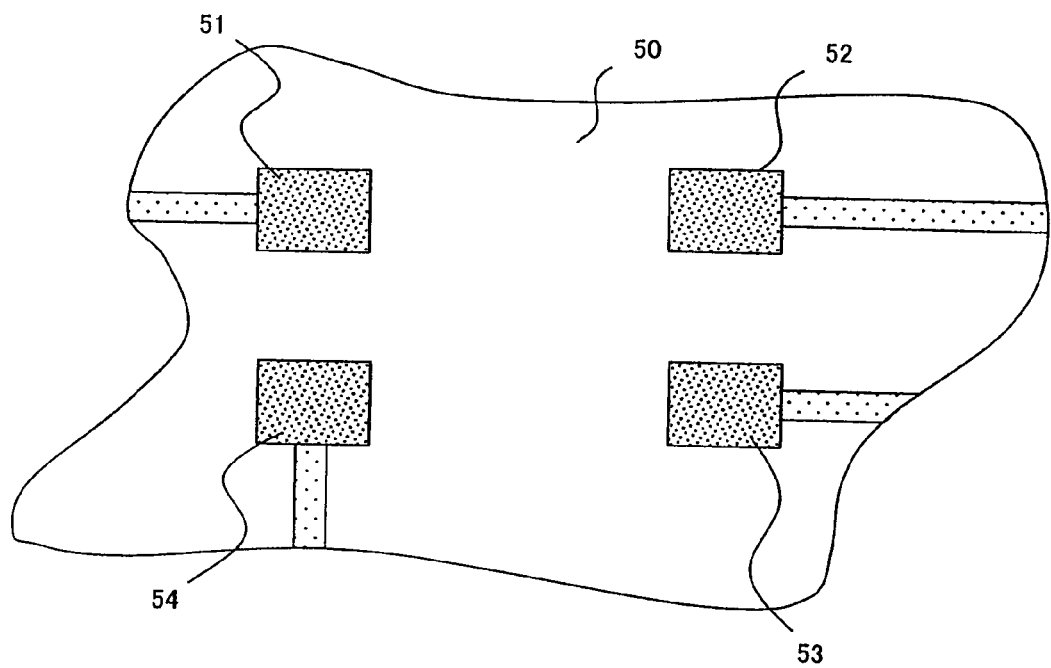
FIG. 5 is the top view the conventional set substrate used to explain the problem.

FIG. 6 is the exploded view of the crystal oscillator in one preferred embodiment of the present invention. The same reference numerals are attached to the same components as those of the prior crystal oscillator shown in FIG. 1 and their descriptions are simplified or omitted. The shape of each groove is not limited to a katakana character "ユ".

As described above, the crystal oscillator comprises a circuit substrate 13 on which a crystal vibrator 11, a circuit device 12 and the like are mounted, and its metal cover 14. The circuit substrate 13 is rectangular and has grooves 15 in the shape of a katakana character "ユ" when viewed from top at the center of each short side and at one end of each long side. The metal cover 14 has projections 16 at the center of each short side and at one end of each long side, corresponding to the grooves 15 of the circuit substrate 13. The projections of the metal cover 14 are fitted in the grooves of the circuit substrate 13 and are jointed by soldering.

In such a configuration, the direction of the crystal oscillator can be recognized by the groove 15 of the circuit substrate 13 and the projection 16 of the metal cover which are provided at one end of each long side. In this case, characters are printed in advance, for example, based on one end provided with the projection 16. Then, by fitting the projection at one end of the metal cover 13 with printed characters in the groove 15 at one end of the circuit substrate 13 on which each circuit terminal is regularly provided, the metal cover 14 can be correctly jointed with the circuit substrate 13. Thus, the crystal oscillator can be correctly mounted on the set substrate 50.

Even when characters are printed after jointing the metal cover with the circuit substrate, they can be printed based on the projection 16 at one end of the metal cover 14. In this case, the characters are correctly arrayed, and accordingly the crystal oscillator can be correctly mounted on the set substrate.

What is claimed is:

1. A crystal oscillator which comprises a rectangular circuit substrate for mounting circuit devices and its metal cover, said circuit substrate has grooves on each long side and on each short side, and said metal cover has projections at each aperture end corresponding to the grooves, and which has a swelling from external to internal in each of the projections, wherein both the grooves provided on each long side or each short side and the projections of said metal cover are provided at one end of each long side or each short side, so that said cover can only be placed over said mounting circuit devices and said substrate in one orientation, whereby associated code characters on said cover are correctly oriented over said mounting circuit devices, and are correctly oriented with respect to the substrate.

2. The crystal oscillator according to claim 1, wherein each grooves is shaped in a katakana character "ユ" when viewed from top.

* * * * *